United States Patent [19]

Gotman

[11] 4,410,168
[45] Oct. 18, 1983

[54] APPARATUS FOR MANIPULATING A STRETCHED RESILIENT DIAPHRAGM

[75] Inventor: Alexander Gotman, Santa Monica, Calif.

[73] Assignee: Asta, Ltd., Irvine, Calif.

[21] Appl. No.: 290,890

[22] Filed: Aug. 7, 1981

Related U.S. Application Data

[62] Division of Ser. No. 167,667, Jul. 11, 1980, Pat. No. 4,296,542.

[51] Int. Cl.³ ............................................. B25B 11/00
[52] U.S. Cl. ................................................... 269/21
[58] Field of Search ................. 29/574, 583, 413, 423; 225/94; 324/62; 414/787, 416; 269/21-22, 13-14; 294/64 R; 279/3 R

[56] References Cited

U.S. PATENT DOCUMENTS

| | | | |
|---|---|---|---|
| 3,167,326 | 1/1965 | Hessels | 269/21 |
| 3,437,343 | 4/1969 | Greck | 279/3 |
| 3,448,510 | 6/1969 | Bippus et al. | 29/413 |
| 3,461,537 | 8/1969 | Lotz | 29/413 |
| 3,559,054 | 1/1971 | Bowers | 324/62 R |
| 3,602,543 | 8/1971 | Sjodin | 294/64 R |
| 3,627,338 | 12/1971 | Thompson | 279/3 |
| 3,727,282 | 4/1973 | Neary | 29/413 |
| 3,766,638 | 10/1973 | Moore | 29/583 |

Primary Examiner—Robert C. Watson

Attorney, Agent, or Firm—Gene W. Arant; Paul H. Ware

[57] ABSTRACT

In a manufacturing operation, a stretched diaphragm is used to support a quantity of small parts which are individually secured to the diaphragm in predetermined spaced relation. An individual part is elevated relative to the remainder of the array, for purpose of inspection or test, by displacing and even further stretching the associated portion of the diaphragm; then it is permitted to return to its original place in the array. When the parts are to be incorporated into manufactured assemblies each selected part is again elevated by displacing and stretching the associated portion of the diaphragm. The method is applied to the manufacture of microminiature electric circuits in which a flat wafer is first formed, and the wafer is then cut into a number of chips which must be individually tested and then they are incorporated into circuit assemblies. Apparatus for carrying out the method includes a support member having a flat upper surface, an annular opening in the flat surface forming a suction ring, means for applying vacuum to the suction ring, a central hole in the flat surface within the suction ring, and a pusher member that can be selectively raised from within the central hole. The apparatus also includes means for creating a vacuum at the periphery of the central hole, and internal controls for controlling the sequence of operation of the two vacuum means and the pusher member.

16 Claims, 15 Drawing Figures

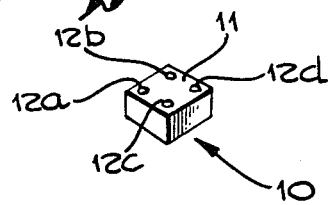
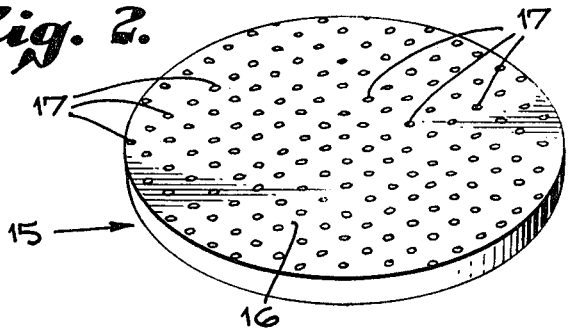
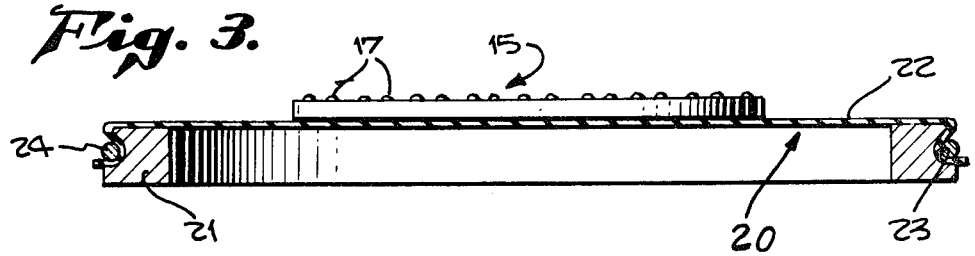
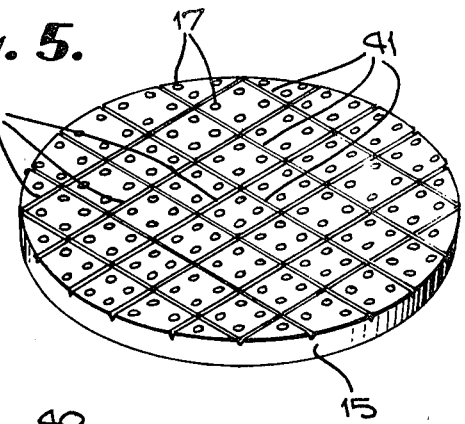
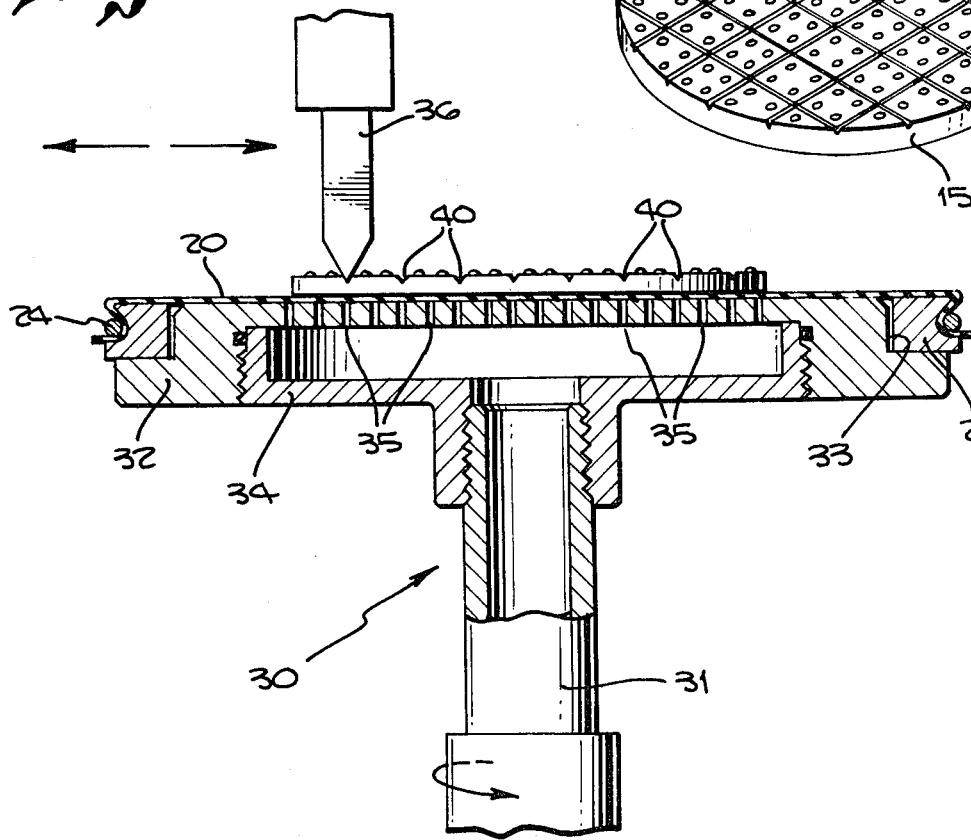

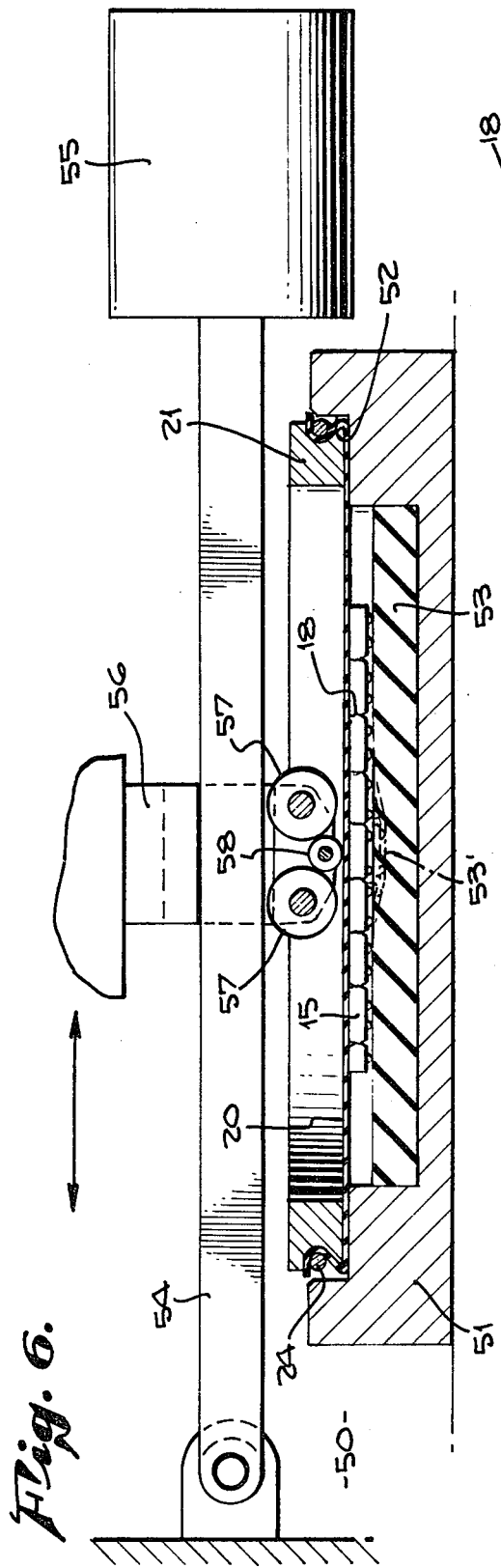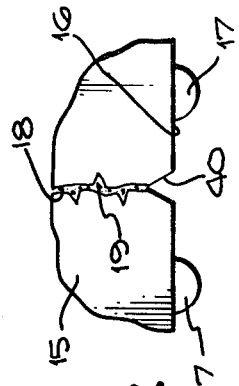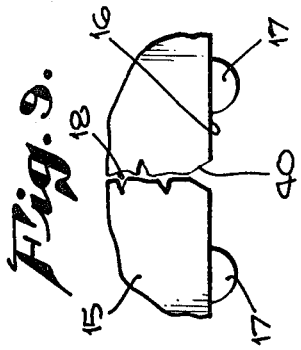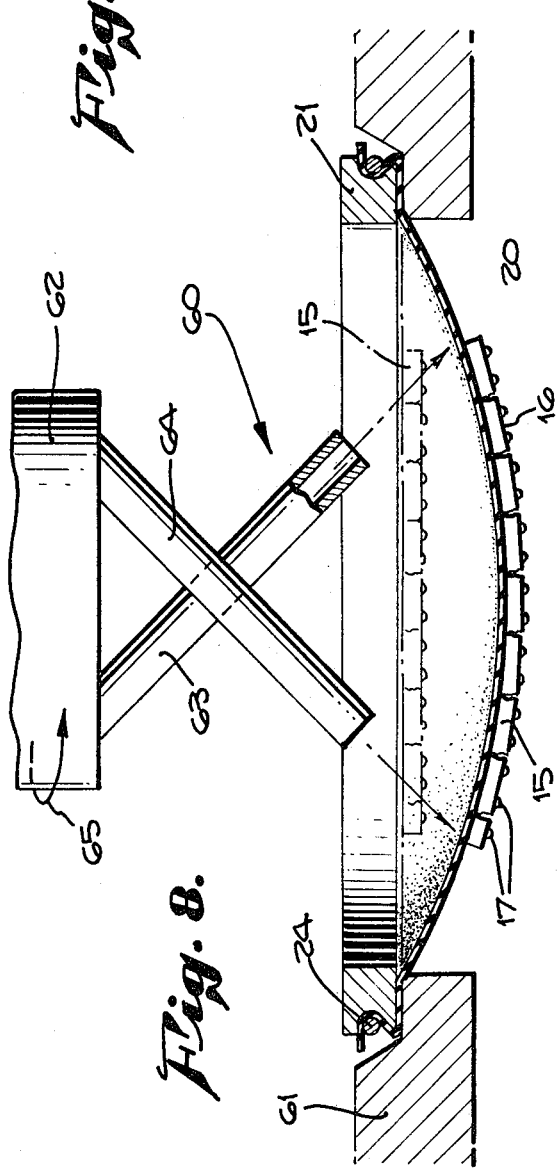

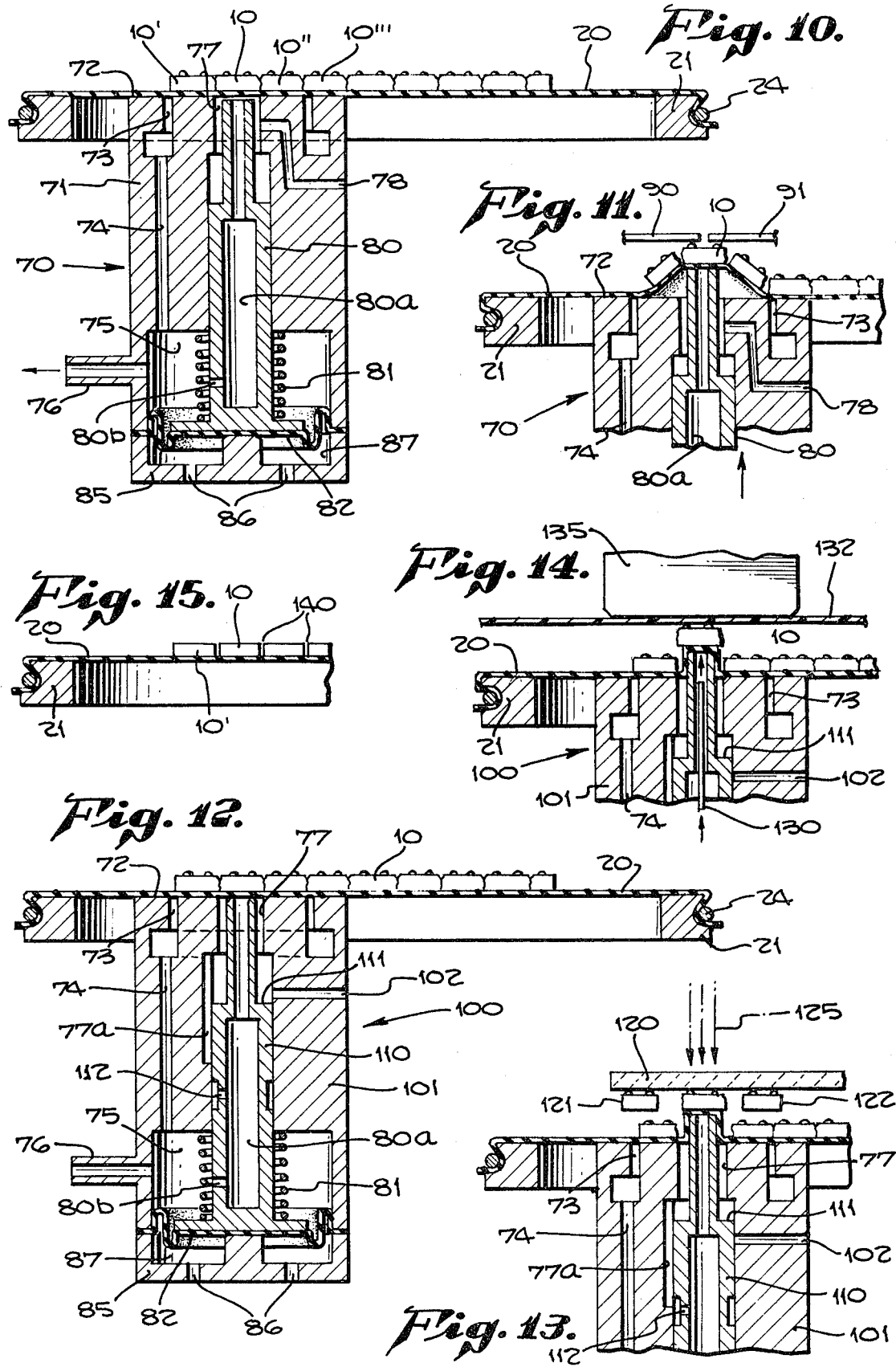

APPARATUS FOR MANIPULATING A STRETCHED RESILIENT DIAPHRAGM

RELATED APPLICATION

This application is a division of my prior copending application Ser. No. 167,667 filed July 11, 1980, now U.S. Pat. No. 4,296,542, issued Oct. 27, 1981.

BACKGROUND OF THE INVENTION

In manufacturing operations it is often necessary to handle a large quantity of small parts which may be of similar or even identical characteristics and which must be individually inspected, tested, and assembled into final products. If the inspection or test procedure indicates that a particular part must be rejected then either it must be removed entirely or marked or else a record must be kept indicating that the particular part is not to be used in the manufacture of an assembly. Furthermore, it is advantageous to handle the parts, and to inspect and test them, by means of automatic machinery wherever possible, but in such a way that the parts will not be damaged.

The specific technology to which the present invention is directed is the manufacture of microminiature electronic assemblies from semiconductor wafers that are then cut into individual chips or dice. Such wafers are generally made in a flat configuration similar to a pancake but have mechanical characteristics similar to glass. The individual chips are so small that handling them, whether manually or by machine, is inherently difficult.

Thus the object and purpose of the present invention is to provide a method and apparatus for fabricating, testing, and assembling small parts in a way that is effective and economical.

More specifically, the object of the invention is to fabricate, test, and assemble the semiconductor chips that are required in microminiature electronic assemblies, in a manner that is fast, reliable, economical, and which minimizes damage to the chips.

SUMMARY OF THE INVENTION

According to the present invention the handling of a quantity of small parts in a manufacturing operation is accomplished by supporting the parts in spaced relation on the upper surface of a prestretched resilient diaphragm and securing each individual part to the diaphragm. This provides a parts array of known configuration which permits each part to be individually identified while it is being inspected, tested, and assembled into a final product.

More specifically, the technique is applied to the semiconductor chips or dice that are incorporated in microminiature electronic assemblies, and is extended not only to the testing and assembly of the chips or dice but also to their initial fabrication. That is to say, a flat semiconductor wafer from which the chips or dice are to be made is first placed upon the stretched resilient diaphragm, the entire surface of the wafer is adhesively secured to the diaphragm, and then the wafer is cut to form the individual semiconductor chips while still being secured to the stretched diaphragm. As a result, the individual chips when formed are securely supported on the diaphragm in a known spaced relationship.

Further in accordance with the invention an individual part such as a semiconductor chip is separated from the array of parts, for purpose of inspection and test, by further stretching the particular portion of the previously stretched diaphragm upon which the individual chip is supported. When the inspection or test is completed the diaphragm is permitted to return to its previous position and thereby restores the chip to its previous position in the array.

The invention also provides special apparatus for securing a stretched diaphragm around a circular portion thereof while at the same time further stretching a selected portion of the diaphragm away from the plane of the aforesaid circular portion. In accordance with the invention this technique is not only used in the inspection and testing of parts, but is also subsequently used again when the same parts are assembled.

DRAWING SUMMARY

FIG. 1 is a perspective view of an individual semiconductor chip;

FIG. 2 is a perspective view of a semiconductor wafer taken from the side which bears the protruding electrodes or contact bumps;

FIG. 3 is a side elevation view of a wafer of FIG. 2 showing in cross-section a stretched resilient diaphragm upon which the wafer has been placed;

FIG. 4 is a side elevation view of the wafer and stretched diaphragm supported in a cutting machine;

FIG. 5 is a perspective view of the wafer after cut lines have been scribed on it by the cutting machine;

FIG. 6 shows the wafer and stretched diaphragm turned upside down and placed in a cracking machine for cracking the wafer from its back side;

FIG. 7 is a fragmentary view of the wafer showing one of the crack lines;

FIG. 8 is a side elevation view of the wafer and stretched diaphragm when placed in a shaking machine;

FIG. 9 is a fragmentary view of the wafer like FIG. 7 but showing fragments removed from the crack;

FIG. 10 shows the stretched diaphragm bearing the array of chips, and a special machine placed underneath the diaphragm for elevating a selected one of the chips;

FIG. 11 is a fragmentary view of the machine of FIG. 10 showing one of the chips in elevated position and being electrically tested;

FIG. 12 is a view like FIG. 10 but showing a modified form of the elevator machine;

FIG. 13 is a fragmentary view of the machine of FIG. 12 showing a selected chip elevated and being bonded into an assembly;

FIG. 14 is a view similar to FIG. 13 but showing a still further modification of the elevator machine; and FIG. 15 is a fragmentary view of a stretched diaphragm and chip array in which the chips were formed by sawing rather than by cracking.

PREFERRED EMBODIMENT

(FIGS. 1-13)

Reference is now made to FIGS. 1 through 13, inclusive, illustrating the presently preferred embodiment of the invention.

FIG. 1 shows a typical semiconductor chip 10 having an upper flat surface 11 upon which individual electrodes or protruding contact bumps 12a, 12b, 12c, 12d are formed. In the horizontal plane the chip 10 is of square configuration but its vertical thickness measured perpendicular to the upper face 11 is significantly less than its other two dimensions. If formed by breaking rather than by sawing, its side walls are of very uneven configuration.

Referring to FIG. 2, a semiconductor wafer 15 is of flat circular configuration and has a flat upper surface 16 upon which a large number of protruding electrodes or contacts 17 are formed. It will be seen that the protruding contacts are arranged in rows and columns for reasons that will soon be apparent.

SUPPORTING WAFER ON PRESTRETCHED DIAPHRAGM

FIG. 3 shows a stretched resilient diaphragm 20 supported upon a circular holder or frame 21. The diaphragm or resilient film 20 is preferably made of natural latex having a considerable ability to stretch and also being characterized by the fact that it normally regains its original configuration even after considerable stretching. The resilient diaphragm or film 20 is of such size that, when stretched, it is substantially larger than the wafer 15. The holder or frame 21 is of a generally ring-shaped configuration but its radial cross-section, as shown in FIG. 3, is nearly square. The holder has a groove 23 extending around its entire periphery. Diaphragm 20 after being stretched is bent around the sharp corner 22 of the holder and then passes across the groove 23, where it is securely clamped in place by means of a clamp ring 24. The clamp ring may be a separate part or may be part of the diaphragm itself.

In carrying out the novel method of the present invention it is necessary to utilize a stretched resilient diaphragm, such as the diaphragm 20. Holder 21 with clamping ring 24 is a convenient means of maintaining the diaphragm in a stretched condition, and also provides the capability of manipulating the diaphragm or moving it about as desired. Once the diaphragm 20 has been placed on its holder 21 it remains there throughout the entire method or process of the invention.

FIG. 3 also shows the wafer 15 placed upon the prestretched diaphragm 20. Although not specifically shown in the drawing, the flat under surface of wafer 15 in its entirety is adhesively secured to the diaphragm. The adhesive material should be selected to have resilient characteristics which are preferably the same as those of the diaphragm.

CUTTING AND BREAKING THE WAFER

After the diaphragm has been stretched, and the wafer secured upon it, the next step of the process is to scribe cutting lines upon the exposed surface of the wafer. This is done by means of a cutting machine 30 as shown in FIG. 4. Cutting machine 30 includes a vertical shaft 31 whose upper end supports a flat circular turntable 32. Turntable 32 has a circumferential notch or shoulder 33 on its upper or peripheral surface, which is adapted to rather snugly receive the diaphragm holder 21. With the holder positioned in that manner the stretched diaphragm 20 is firmly supported by the upper surface of turntable 32. A vacuum chuck 34 carried on the upper end of shaft 31 supports turntable 32, and through openings 35 in the turntable the vacuum is effectively communicated to diaphragm 20. Also included in the cutting machine 30 is a diamond-tipped cutter 36. The cutter is used to make a set of parallel scribe lines 40. After the set of parallel lines 40 are made, shaft 31 is rotated 90 degrees in order to rotate the turntable 32 a similar amount, and then the scriber is used to make another set of parallel cutting lines 41 which are perpendicular to the first set of lines 40. The appearance of wafer 15 after the two sets of parallel but mutually perpendicular scribing lines have been made is as shown in FIG. 5.

From FIG. 5 it is apparent that the cutting lines 40, 41 are located in such manner as to delineate a number of chips such as the chip 10 shown in FIG. 1. Thus, when a separation of the wafer at the cutting lines has been achieved there will be a number of individual chips formed that will be identical to the chip 10.

After the wafer has been cut or scribed as shown in FIGS. 4 and 5 the next step is to crack it underneath the scribe lines. A special cracking machine 50 which will accomplish this is shown in FIG. 6. Holder 21 is inverted so that wafer 15 is now suspended from the under side of diaphragm 20. A support block 51 has a circumferential shoulder 52 which receives the holding ring 21, or more correctly, which receives that portion of the diaphragm 20 that was formerly on the upper side of the holding ring but is now on its bottom side. A resilient support pad 53 is positioned on the interior of support block 51 and is of such vertical thickness that the wafer 15 rests upon its upper surface. More specifically, it is the protruding electrodes 17 of the wafer which rest upon the upper surface of the resilient support pad 53.

An arm 54 extends horizontally across the upper side of holder 21 in spaced relation thereto and is suitably weighted as by the weight 55. A roller carriage 56 is adapted to travel along the arm 54. On its under side the roller carriage carries a pair of relatively large rollers 57 which are spaced from each other and also from the under surface of the arm 54. Rollers 57 are made of rigid material. A much smaller roller 58 is rotatably supported by the roller carriage 56 intermediate to the rollers 57 and at a somewhat lower elevation. Roller 58 is engaged by both of the rollers 57, throughout the full length of all three rollers, and as the roller carriage 56 traverses along the arm 54 the rotation of roller 58 provides a source of driving rotation for the idler rollers 57.

The roller 58 is specifically designed for the purpose of cracking the wafer 15 from its back side, and in order to do that must be of small diameter and made of very hard material. While only one part of carriage 56 is shown, together with an arm 54, it should nevertheless be understood the carriage 56 and cracking roller 58 have sufficient length to extend the full diameter of the wafer 15. Bending of the cracking roller 58 is prevented or at least restricted by its supporting rollers 57. The wafer 15 is placed in the cracking machine 50 in such manner that one set of the scribe lines are perpendicular to the arm 54. Therefore, movement of the carriage along the arm causes the cracking roller 53 to apply considerably downward force upon the wafer above successive ones of the scribe lines, thereby cracking the wafer above each of the scribe lines. The cracking lines are shown in FIG. 6, a typical one being identified by reference numeral 18.

Also shown in FIG. 6 is a dotted line 53' which illustrates, in exaggerated form, a depressed position that is assumed by the upper surface of resilient support pad 53 when the cracking roller passes by. Since the resilient support pad compresses in a downwardly direction, the wafer 15 is able to bend sufficiently to cause the desired cracking action to occur.

ELIMINATING FRAGMENTS BETWEEN CHIPS

FIG. 7 is a fragmentary view of the wafer after it has been cracked. The wafer 15 has its surface 16 facing downwardly and there are spaced electrodes 17 on that surface. A scribe line 40 was made on surface 16 intermediate to two of the electrodes 17. As the result of the operation shown and described in connection with FIG. 6 there is a fracture line 18 which now extends upward from scribe line 40 through the entire thickness of the wafer 15. Fracturing of the wafer 15 has resulted in a number of fragments such as the fragment 19 which are captured inside the fracture line.

FIG. 8 illustrates the method of removing the fragments such as fragment 19. A shaker machine 60 includes a holder 61 that is similar to the holder 51 except that it is open at the center. Holder 21 with diaphragm 20 and the newly formed chips is placed in the holder 61. An air box 62 is positioned some distance above the holder 21. Air tubes 63 and 64 extend downward from the air box 62, in angled relation to the air box, and mutually inclined to each other. Pressurized air is supplied to the air box and hence flows down through the tubes 63, 64 and onto the exposed surface of diaphragm 20. Air box 62 is driven in rotation by the jet reaction about a vertical axis as indicated by the arrow 65. One effect of the pressurized air streams is to push the diaphragm downward, hence stretching it, and increasing the spaces between the chips. Another effect of the air streams is to jostle the diaphragm and chips, thus accelerating the removal of the fragments. Rotation of the air box ensures that this jostling action occurs continuously but in an uneven pattern such that removal of all of the fragments will be accomplished. FIG. 9 is a fragmentary view like FIG. 7 but showing a fracture line empty from fragments removed after the shaking action has been completed.

ELEVATING A SELECTED CHIP

In FIG. 10 the holder 21 and diaphragm 20 are again inverted so as to resume their original position. The diaphragm no longer supports the wafer 15 but instead supports an array of individual chips which are identified by reference numerals 10, 10', 10'', etc. A diaphragm manipulator machine or elevator 70 has been placed underneath the diaphragm.

Manipulator or elevator 70 includes a base member 71 having a flat upper surface 72. The flat surface 72 has an annular opening 73 formed therein. Opening 73 communicates through an internal passageway 74 with an air chamber 75 that is formed in the lower end of the base member 71. Air chamber 75 in turn communicates with exterior coupling 76. Vacuum may be applied through coupling 76, air chamber 75, passageway 74, and annular opening 73 to a circular portion of the under surface of diaphragm 20. Since operation of the invention depends upon the application of vacuum to air chamber 75, the air chamber 75 may, therefore, be alternatively referred to as a vacuum chamber.

Base member 71 also has a central opening 77 in its upper surface 72. A horizontal relief passage 78 communicates between opening 77 and the exterior of the base member. A pusher 80 is positioned within the central opening 77. Pusher 80 normally has its upper end flush with the upper surface 72 of base member 71, as shown in FIG. 10.

When a particular chip such as the chip 10 is to be selected, the procedure is as follows. Manipulator or elevator machine 70 is so positioned underneath the diaphragm that pusher 80 is vertically aligned with the chip 10. Vacuum is applied through coupling 76 to a circular portion of the under surface of diaphragm 20, but more correctly, to a narrow strip which is of circular configuration and corresponds to the upper surface of opening 73. This application of vacuum holds down the above-mentioned strip of the diaphragm when the pusher is later raised.

Pusher 80 is then raised in order to raise the associated portion of diaphragm 20 and thereby elevate the selected chip 10. The elevated position of the chip is shown in FIG. 11. The raising of pusher 80 is accomplished automatically, by means of the pusher mechanism as shown in FIG. 10, as will now be described.

Pusher 80 is normally held in its lower position as shown in FIG. 10, by means of coil spring 81 disposed about the pusher within air chamber 75. A floating diaphragm 82 is secured across the bottom end of pusher 81 and has its outer periphery grasped between the bottom end of support member 71 and a bottom cap member 85. Bottom cap 85 has openings 86 which communicate between atmosphere and internal chamber 87 formed within the bottom cap. Thus, chamber 87 is at atmospheric pressure at all times.

Application of vacuum through coupler 76 to vacuum chamber 75 creates a partial vacuum in vacuum chamber 75 as well as in the annular opening 73. Thus, the same event which causes diaphragm 20 to be gripped at the annular opening 73 also creates a differential pressure across the movable diaphragm 82. This differential pressure causes pusher 80 to move upward. The magnitude of vacuum required to grip the annular portion of the diaphragm is much less than that requried to drive the pusher, hence these two events always occur in the sequence that is desired.

ELECTRICAL TEST

As shown in FIG. 11 the elevating of chip 10 has also caused that part of the prestretched diaphragm 20 which lies within the suction ring 73 to stretch even further. Chip 10 is elevated significantly above the immediately adjacent chips 10' and 10''. These adjacent chips are also turned at an angle, which has the effect of unlocking adjoining edges. The flat contact plates 90, 91 of an electrical test instrument can therefore be placed upon the upper ends of the electrodes 12 of the chip 10. Although only two such contact plates are shown in FIG. 11 it will be understood that in fact four are used, one for each of the electrodes 12. It is therefore possible for the test instrument, not specifically shown, to fully test the electrical characteristics of the chip 10.

REGAINING ORIGINAL POSITION

After the electrical test is made the chip 10 is returned to its previous position in the array, as shown in FIG. 12. This is accomplished by relieving the vacuum and allowing pusher 80 to retract under the force of spring 81. This action is improved by also applying air pressure through coupler 76. That portion of the diaphragm 20 lying within the suction ring 73 therefore contracts back to its originally stretched condition. The original spatial relationship between chip 10 and the other chips of the array is fully regained.

Precision in controlling movement of the chip 10 is aided in the following manner. Pusher 80 has a hollow interior chamber 80a as shown in FIG. 10 which extends its full length and opens to its upper end. Near its lower end pusher 80 has a lateral passageway 80b which communicates between the chamber 80a and air chamber 75. Thus, application of vacuum to chamber 75 also results in application of vacuum through chamber 80a to the under surface of diaphragm 20 immediately beneath the chip 10. Any lateral shifting of the chip 10 relative to the upper end of pusher 80 is therefore inhibited.

It should also be noted that the concentric location of suction ring 73 relative to chip 10 is very important because stretching of the diaphragm creates symmetrically balanced forces, thereby accurately maintaining the lateral position of chip 10.

RE-ELEVATING THE CHIP

FIG. 12 shows a modified form 100 of the diaphragm manipulator which is used when the chips are to be welded into electrical circuit assemblies. Upper flat surface 72, suction opening 73, internal passage 74, air chamber 75, and external coupler 76 are the same as in the previous version of the diaphragm manipulator. Bottom cap 85 is the same with its air passages 86 and chamber 87. Movable diaphragm 82 is the same as before. Central opening 77 is mainly the same as before, but there is a change. Lateral passageway 78 is no longer used, and in its place the support member 101 has a lateral passageway 102 which is differently located. More specifically, plunger 110 is wide at the bottom end and narrow at its upper end, the two diameters being separated by a circumferential shoulder 111. In the lower or retracted position of the pusher or plunger as shown in FIG. 12 the passageway 102 communicates with central opening 77 above the shoulder 111. A short upward movement of the pusher, however, causes the shoulder to pass the passageway 102 which is therefore closed off.

Pusher 110 retains the internal chamber 80a and its communicating passage 80b. In addition there is another lateral passage 112 which is well below the lateral passage 102, but well above the vacuum chamber 75, so that it normally provides no communication to the interior chamber 80a. But the central opening 77 is enlarged at one point on its circumference by an auxiliary channel 77a which extends lengthwise of the pusher or plunger 110. When pusher 110 is raised further, with passageway 102 already closed off, and another relatively short distance the lateral passageway 112 comes into communication with the lower end of auxiliary passageway 77a. This results in the communication of vacuum through coupler 76, chamber 75, passageway 80b, chamber 80a, passageway 112, passageway 77a, and central opening 77 to the under surface of diaphragm 20. Thus an inner vacuum ring is formed at the periphery of central opening 77 which is concentric to the earlier described vacuum ring 73 and approximately coincides with the lateral boundaries of chip 10.

BONDING INTO ASSEMBLY

The operation of the machine for bonding the part is as follows. Application of vacuum through coupler 76 causes the diaphragm 20 to be gripped at the ring 73, and also causes diaphragm 20 to be gripped underneath the chip 10 through the hollow upper end of pusher 110. Pressure differential on movable diaphragm 82 causes pusher 110 to move upward. After a short movement the relief passage 102 is closed. At this time the position of the parts, not specifically shown in the drawings, is such that chip 10 is partially elevated and the adjacent edges of chips 10' and 10" are also elevated somewhat. Then there is a further upward movement of pusher 110 which brings passageway 112 into communication with passageway 77a, thus creating a vacuum suction in the inner vacuum ring 77. This draws the portion of the diaphragm carrying adjacent chips 10' and 10" back down so that they again rest upon the upper surface of the support member, as shown in FIG. 13. Thus chip 10 is fully exposed and fully separated from its adjacent chips for purpose of bonding.

As shown in FIG. 13 a substrate 120 has previously had chips 121, 122 bonded to its under side. Chip 10 is now appropriately positioned between the chips 121 and 122, with its electrodes engaging the under surface of the member 120, and hence is in position to be bonded. Laser beam 125 directed from the upper side of member 120 provides the necessary heating energy for completing the desired bond. Chip 10 is then detached or separated from the carrier or diaphragm 20, which is then withdrawn back to its normal position. Detachment of chip 10 is preferably accomplished by maintaining vacuum on the under side of the diaphragm while raising the substrate vertically so that the chip, already bonded to the substrate, is torn from the diaphragm.

ALTERNATE FORMS

FIG. 14 shows chip 10 being bonded to a substrate 132 by means of a thermo-compression heater 135. The construction of the diaphragm manipulator is the same as shown in FIGS. 12 and 13 except that a tube 130, concentric to the chamber 80a of the pusher, directs a stream of cooling water against the under surface of the diaphragm 20 immediately beneath the chip 10.

FIG. 15 shows an alternate form of the method in which the individual chips have been separated by means of saw cuts 140 rather than by the cracking method previously described.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

What is claimed is:

1. Apparatus for manipulating a stretched, resilient diaphragm from its under side comprising, in combination:

a support member having a flat upper surface adapted to engage the under surface of the diaphragm, said flat upper surface having an annular opening formed therein;

means for applying vacuum to said annular opening thereby to grip a corresponding annular portion of the under surface of the diaphragm;

said support member also having a central hole therein positioned concentric to said annular opening;

a pusher member positioned within said central hole; and selectively operable means for raising said pusher so as to thereby elevate an associated portion of the diaphragm relative to said annular portion thereof.

2. Apparatus as in claim 1 which further includes means for applying a vacuum to the periphery of said central hole.

3. Apparatus as in claim 1 wherein said means for raising said pusher is actuated by said means for applying a vacuum to said annular opening.

4. Apparatus as in claim 3 which further includes means for applying a vacuum to the periphery of said central hole.

5. Apparatus for manipulating a stretched, horizontally disposed resilient diaphragm from its under side comprising, in combination:
- a support member having a flat upper surface adapted to engage the under surface of the diaphragm, said flat upper surface having an annular opening formed therein;
- means for applying vacuum to said annular opening thereby to grip a corresponding annular portion of the under surface of the diaphragm;
- said support member also having a central hole therein positioned concentric to said annular opening;
- a pusher member positioned within said central hole, said central hole being of substantially larger diameter than said pusher member, thereby providing an annular space around said pusher member;
- means for applying vacuum to said annular space;
- means for selectively raising said pusher; and
- control means operable for first applying vacuum to said annular opening, then raising said pusher member, and thereafter applying vacuum to said annular space.

6. Apparatus as in claim 1 wherein said pusher member has a central opening extending through its length, and which further includes means for applying vacuum to said central opening.

7. Apparatus as in claim 5 wherein said control means is actuated by a single push button.

8. Apparatus for manipulating small parts adhesively attached to one side of a stretched, resilient diaphragm comprising:
- a base member having a flat upper surface for receiving the resilient diaphragm, said flat upper surface having an annular opening formed therein;
- said base member also having a vacuum chamber with an exterior coupling and an internal passageway providing fluid communication between said vacuum chamber and said annular opening;
- an elongated central opening communicating with said flat upper surface of said base member;
- a relief passage providing fluid communication between said central opening and the exterior of said base member;
- a movable diaphragm closing the bottom of said central opening of said base member;
- a bottom cap separated from said base member by said movable diaphragm;
- an elongated movable pusher disposed within said elongated central opening, said pusher having a wide bottom end, an intermediate portion and a narrow upper stem portion; and
- a coil spring disposed within said vacuum chamber and about said intermediate portion of said pusher for retracting said pusher and tending to urge said wide bottom end of said pusher into contact with said movable diaphragm.

9. The apparatus of claim 8 wherein said bottom cap comprises:
- at least one exterior opening; and
- at least one internal chamber.

10. The apparatus of claim 8 wherein said intermediate portion of said pusher comprises:
- a hollow interior chamber; and
- a lateral passageway providing fluid communication between said vacuum chamber and said hollow interior chamber.

11. The apparatus of claim 8 wherein said narrow upper stem portion of said pusher is hollow and open at its upper extremity so as to provide fluid communication with said flat upper surface.

12. Apparatus for manipulating small parts adhesively attached to one side of a stretched, resilient diaphragm comprising:
- a base member having a flat upper surface for receiving the resilient diaphragm, said flat upper surface having an annular opening formed therein;
- said base member also having a vacuum chamber with an exterior coupling and an internal passageway providing fluid communication between said vacuum chamber and said annular opening;
- an elongated central opening communicating with said flat upper surface of said base member;
- a relief passage providing fluid communication between said central opening and the exterior of said base member;
- a movable diaphragm closing the bottom of said central opening of said base member;
- a bottom cap separated from said base member by said movable diaphragm, said bottom cap having at least one exterior opening and an internal chamber;
- an elongated pusher disposed within said central opening and axially movable therein, said pusher having a wide bottom end, an intermediate portion having an interior chamber and a lateral passageway which provides fluid communication with said vacuum chamber, said pusher also having a narrow upper stem portion with a hollow interior passageway providing fluid communication between said interior chamber and said flat upper surface;
- the end of said pusher stem normally being flush with said flat upper surface of said base member, except when said annular opening is closed off by the resilient diaphragm; and
- a coil spring disposed within said vacuum chamber and about said intermediate portion of said pusher for normally holding said pusher in a retracted position and urging said wide bottom end of said pusher into contact with said movable diaphragm;
- the placement of the resilient diaphragm on said flat upper surface causing vacuum normally lost through said annular opening to be retained in said vacuum chamber so that ambient atmospheric pressure at said bottom cap exterior opening will overcome the force of said spring and cause said pusher to extend beyond said flat upper surface.

13. The apparatus of claim 8 wherein said central opening in said base member is enlarged in a lengthwise dimension about its circumference by an auxiliary channel.

14. The apparatus of claim 13 wherein said pusher disposed within said central opening comprises:
- a hollow interior chamber in said intermediate portion;
- a shoulder portion separating said intermediate portion from said narrow upper stem portion;
- a first lateral passage disposed below said shoulder in fluid communication with said hollow interior chamber; and a second lateral passage disposed below said first lateral passage and in fluid communication with said hollow interior chamber and said vacuum chamber.

15. The apparatus of claim 14 wherein said bottom cap comprises:

at least one exterior opening; and
at least one internal chamber.

16. The apparatus of claim 15 wherein said narrow upper stem portion of said pusher is hollow and open at its upper extremity so as to be in fluid communication with said flat upper surface.

* * * * *